United States Patent
Martin

(10) Patent No.: US 6,222,942 B1
(45) Date of Patent: Apr. 24, 2001

(54) METHOD AND APPARATUS FOR COMPRESSING AND DECOMPRESSING MESSAGES

(75) Inventor: Jean-Marie Martin, Asnieres (FR)

(73) Assignee: Alcatel Mobile Phones, Paris (FR)

( * ) Notice: Subject to any disclaimer, the term of this patent is extended or adjusted under 35 U.S.C. 154(b) by 0 days.

(21) Appl. No.: 08/892,091

(22) Filed: Jul. 14, 1997

(30) Foreign Application Priority Data

Jul. 6, 1996 (FR) .................................................. 96 08857

(51) Int. Cl.$^7$ ............................. G06K 9/36; G09G 5/00; H04N 7/12; G06F 7/00
(52) U.S. Cl. .......................... 382/232; 382/233; 345/202; 348/384; 358/426; 708/203
(58) Field of Search .................................... 382/229, 232, 382/240, 245, 246, 233; 345/202; 348/384; 358/426, 261.1; 708/203

(56) References Cited

U.S. PATENT DOCUMENTS

| | | | |
|---|---|---|---|
| 4,386,416 | * | 5/1983 | Giltner et al. .......................... 710/68 |
| 4,560,976 | * | 12/1985 | Finn ........................................ 341/51 |
| 4,562,423 | * | 12/1985 | Humblet ................................ 341/51 |
| 4,597,057 | * | 6/1986 | Snow ..................................... 341/60 |
| 4,612,532 | * | 9/1986 | Bacon et al. .......................... 341/51 |
| 4,626,824 | * | 12/1986 | Larson .................................. 341/95 |
| 4,700,175 | * | 10/1987 | Bledsoe ................................ 341/65 |
| 4,955,066 | | 9/1990 | Notenboom ......................... 382/240 |
| 4,988,998 | * | 1/1991 | O'Brien ................................ 341/55 |
| 5,006,849 | * | 4/1991 | Baarman et al. ...................... 341/95 |
| 5,319,682 | * | 6/1994 | Clark ................................... 375/240 |
| 5,373,290 | * | 12/1994 | Lempei et al. ........................ 341/51 |
| 5,396,228 | * | 3/1995 | Garahi ............................. 340/825.44 |
| 5,442,350 | * | 8/1995 | Iyer et al. ............................. 341/51 |
| 5,485,526 | * | 1/1996 | Tobin .................................. 382/232 |
| 5,537,551 | * | 7/1996 | Denenberg et al. ............ 395/200.77 |
| 5,663,721 | * | 9/1997 | Rossi ................................... 341/51 |
| 5,724,525 | * | 3/1998 | Beyers, II et al. ................... 705/40 |
| 5,838,266 | * | 11/1998 | Honie et al. ......................... 341/51 |
| 5,974,180 | * | 10/1999 | Schwendeman ................... 382/232 |

FOREIGN PATENT DOCUMENTS

| | | | |
|---|---|---|---|
| 0083393A2 | 7/1983 | (EP) | .............................. G06F/15/20 |
| 0280549A2 | 8/1988 | (EP) | .............................. H03M/7/42 |

OTHER PUBLICATIONS

Yeheskel Bar–Ness et al, "Word Based Data Compression Schemes 1", May 8, 1989, Proceedings of the International Sysmposium on Circuits and Systems, Portland, May 8–11, 1989, vol. 1 of 3, pp. 300–308, Institute of Electrical and Electronics Engineers.

* cited by examiner

Primary Examiner—Leo Boudreau
Assistant Examiner—Daniel G. Mariam
(74) Attorney, Agent, or Firm—Sughrue, Mion, Zinn, Macpeak & Seas, PLLC

(57) ABSTRACT

This method of compressing messages, in particular messages intended to be displayed on a telecommunications terminal, in particular a portable telephone, is essentially characterized in that, with said messages being made up of words themselves made up of characters, it includes compiling two encoding tables, namely an "encoding table for compressing words", causing each compressed word represented by its rank in the table to correspond to a "semi-compressed" word made up of a sequence of compressed characters corresponding to the word, and an "encoding table for compressing characters", causing each compressed character represented by its rank in the table to correspond to a non-compressed character.

12 Claims, 3 Drawing Sheets

METHOD AND APPARATUS FOR COMPRESSING AND DECOMPRESSING MESSAGES

FIELD OF THE INVENTION

The present invention relates generally to data compression.

The present invention is more particularly applicable to compressing messages that are intended to be displayed on the screen of equipment such as a telecommunications terminal, in particular a portable telephone, the messages being made up of words themselves made up of characters, the characters themselves being encoded so as to be stored in data-processing means internal to the equipment using a binary code such as the ASCII code, for example. In such an application, message compression makes it possible essentially to reduce the size of memory required for storing the messages, and thus to reduce the size of the circuits internal to such equipment.

BACKGROUND OF THE INVENTION

Various methods of compressing data are known, and they are described, for example, in the book entitled "Compression de données—Méthodes, algorithmes, programmes détaillés" ["Data compression—methods, algorithms, detailed programs"] by Pascal Plume, published by Editions Eyrolles.

Among those methods, reference may be made to the "Huffman" method which acts on characters and which consists in encoding characters that occur relatively frequently over a binary length that is relatively short (compared with conventional binary encoding such as ASCII encoding, for example), and in encoding characters that occur less frequently over a binary length that is longer, the resulting encoding table being conveyed to the apparatus serving to perform the inverse, decompression operation.

Such a method is not suited to compressing messages, in particular in terms of compression ratio, since said words or said messages usually include repetitive sequences of characters.

To avoid that drawback, it is possible to use a method such as the "Lempel-Ziv-Welch" method which enables such repetitive sequences of characters to be compressed by replacing them with their ranks in an encoding table referred to as a "dictionary" and created dynamically as the text to be compressed is read, and recreated in similar manner on decompression. Such a method, also referred to as "on-line textual substitution" offers a better compression ratio than the above-mentioned method. Unfortunately, its main drawback is that it requires a decompression time that is relatively long.

A particular need therefore exists for a method of compressing messages, in particular a relatively large number of messages that are relatively short and that use a relatively limited vocabulary, such as, for example, messages intended to be displayed on the screen of equipment such as a telecommunications terminal, in particular a portable telephone. This need requires in particular a method that offers a decompression time that is sufficiently short while remaining sufficiently economical in terms of compression ratio.

OBJECTS AND SUMMARY OF THE INVENTION

The present invention thus provides a method of compressing messages, in particular messages intended to be displayed on a telecommunications terminal, in particular a portable telephone, wherein, with said messages being made up of words themselves made up of characters, the method includes compiling two encoding tables, namely an "encoding table for compressing words", causing each compressed word represented by its rank in the table to correspond to a "semi-compressed" word made up of a sequence of compressed characters corresponding to the word, and an "encoding table for compressing characters", causing each compressed character represented by its rank in the table to correspond to a non-compressed character.

The present invention also provides a corresponding method of decompressing messages, wherein the method includes addressing two encoding tables respectively with compressed words and with compressed characters, the encoding tables being respectively an "encoding table for compressing words", causing each compressed word represented by its rank in the table to correspond to a "semi-compressed" word made up of a sequence of compressed characters corresponding to the word, and an "encoding table for compressing characters", causing each compressed character represented by its rank in the table to correspond to a non-compressed character.

The present invention also provides corresponding apparatus for decompressing messages, said apparatus essentially including a memory containing two encoding tables, namely an "encoding table for compressing words", causing each compressed word represented by its rank in the table to correspond to a "semi-compressed" word made up of a sequence of compressed characters corresponding to the word, and an "encoding table for compressing characters", causing each compressed character represented by its rank in the table to correspond to a non-compressed character, and means for addressing the two tables, respectively with compressed words and with compressed characters.

BRIEF DESCRIPTION OF THE DRAWINGS

Other objects and characteristics of the present invention appear on reading the following description of an implementation given with reference to the accompanying drawings, in which.

MORE DETAILED DESCRIPTION

Figure 1:
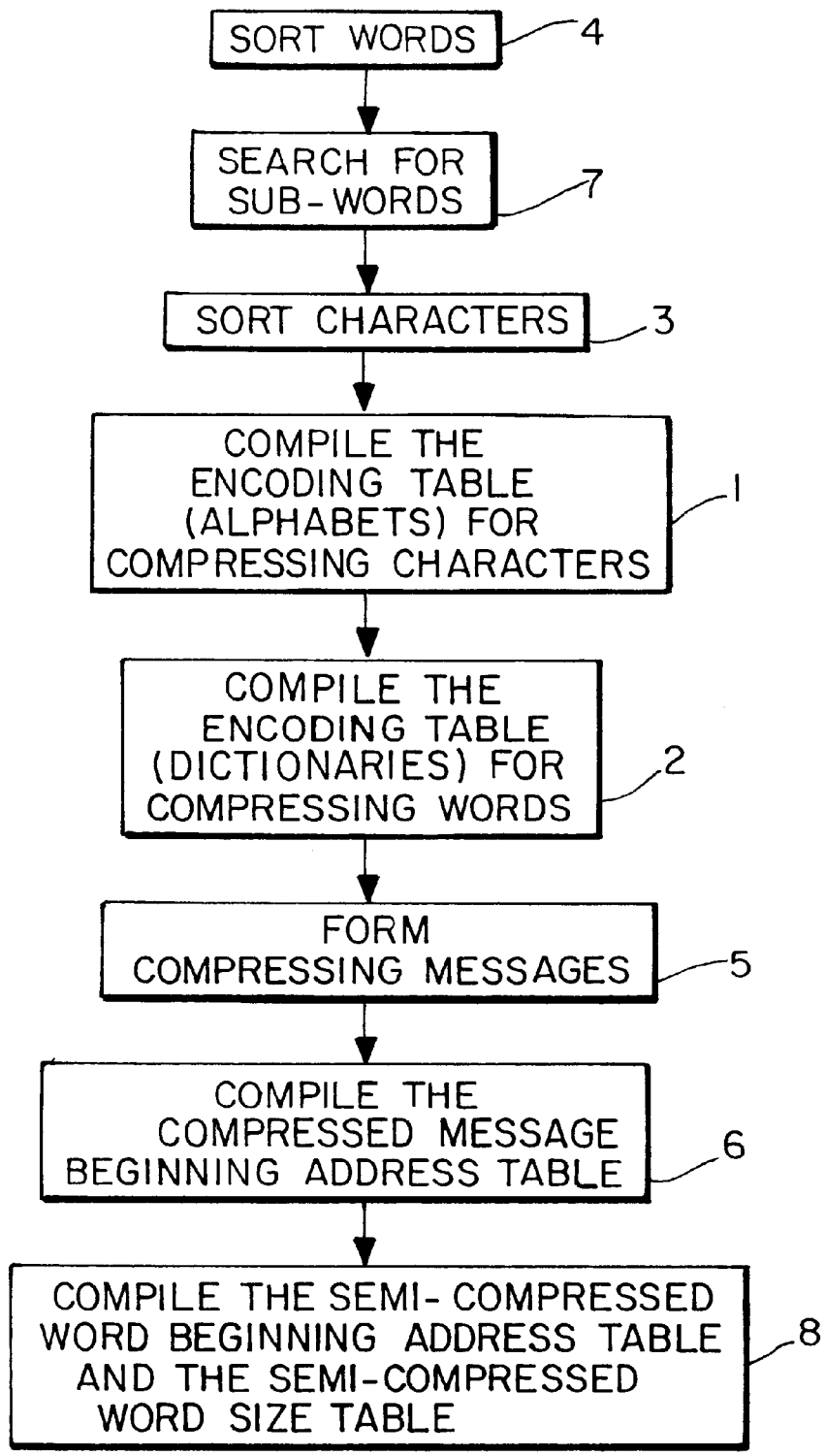
FIG. 1 is a flow chart showing the various steps of an implementation of the compression method of the invention.

The compression method shown in FIG. 1 includes steps respectively referenced 1 and 2 in which respective encoding tables are compiled, namely an "encoding table for compressing words", and an "encoding table for compressing characters", in which tables the following are respectively placed in encoded form: the words making up the messages in question, and the characters making up these words, each character and each word being defined by its rank in such a table, and said rank, once encoded (in a binary code in this example), representing the compressed form of the word or of the character.

An encoding table for compressing characters contains, in this example, characters in non-compressed form, e.g. using a binary code such as the ASCII code.

An encoding table for compressing words contains, in this example, words in a "semi-compressed" form, a semi-compressed word being constituted by a sequence of compressed characters corresponding to the successive characters making up said word.

In the example shown, prior steps, respectively 3 and 4 are also provided for sorting the characters and the words by frequency of appearance in said words and in said messages, and said encoding tables themselves include pluralities of tables referred to respectively as "alphabets" and as "dictionaries", frequently used characters being placed in a small alphabet, i.e. one in which ranks can be encoded using relatively few bits, and frequently used words being placed in a small dictionary, i.e. one in which ranks can be encoded using relatively few bits.

Step 1 in which alphabets are compiled then consists, for example, in placing the 8 most frequently used characters in a first alphabet whose ranks are binary encoded using 3 bits, and in placing the other characters, e.g. of which there are 128, in a second alphabet whose ranks are binary encoded using 7 bits.

Step 2 in which dictionaries are compiled then consists, for example, in placing the 8 most frequently used words in a first dictionary whose ranks are binary encoded using 3 bits, in placing the following 64 words (in order of decreasing frequency of use) in a second dictionary whose ranks are binary encoded using 6 bits, and in placing the other words, e.g. of which there are 1,024, in a third dictionary whose ranks are binary encoded using 10 bits.

The binary code indicating rank in an alphabet or in a dictionary is then preceded by a code serving to indicate the alphabet or the dictionary. In the example considered, the alphabet number can thus be indicated by means of a single-bit binary code, and the dictionary number can thus be indicated by means of a two-bit binary code.

Furthermore, for the purposes of implementing the method, the spaces between words in said messages are considered as words, which enables the compression ratio to be optimized.

A compressed message (step 5) is then formed by replacing each word making up the message with the corresponding compressed word, namely the binary code of the rank of the word in the corresponding dictionary, it being understood that the content of said dictionary at said rank is itself formed by the "semi-compressed" word constituted by the sequence of binary codes of the ranks, in said alphabets, of the characters making up the word.

In addition, in the example considered, since the compressed messages are intended to be stored contiguously in a memory provided in the apparatus serving to perform the inverse, decompression operation, and since the messages are of various sizes, it is necessary to provide a mechanism making it possible to determine the beginning and the end of each compressed message in said memory. In the example considered, this mechanism comprises a step 6 in which a "compressed message beginning address table" is compiled for indicating the addresses of the beginnings of said compressed messages in said memory.

Similarly, since, in the example considered, the semi-compressed words are intended to be stored contiguously in said memory, and since the size of the compressed words varies, it is necessary to provide a mechanism making it possible to determine the beginning and the end of each semi-compressed word in said memory.

Moreover, in the example considered, in order to optimize the compression ratio further, the compression method also includes a step referenced 7 in which a search is made for words, referred to as "sub-words", included within larger words referred to as "root words". Only the root words are placed in the dictionaries, the numbering of the ranks in the dictionaries then being modified so as also to define ranks for the sub-words, and it then being necessary for said mechanism making it possible to determine the beginning and the end of each semi-compressed word in said memory to make it possible to determine the beginning and the end of each semi-compressed word, whether it be a root word or a sub-word.

In the example considered, this mechanism comprises a step 8 in which a "semi-compressed word beginning address table" is compiled serving to indicate the addresses of the beginnings of the semi-compressed words (whether they be root words or sub-words) in said memory, and a "semi-compressed word size table" is compiled for indicating the sizes of the words (whether they be root words or sub-words) in said memory.

Such a semi-compressed word beginning address table and such a semi-compressed word size table are provided for each of said first, second, and third dictionaries.

Furthermore, in the example considered, the character sorting step 3 and the alphabet compilation step 1 are advantageously placed after the word sorting step 4 and after the sub-word search step 7, so as to perform character sorting on the root words only.

Figure 2:
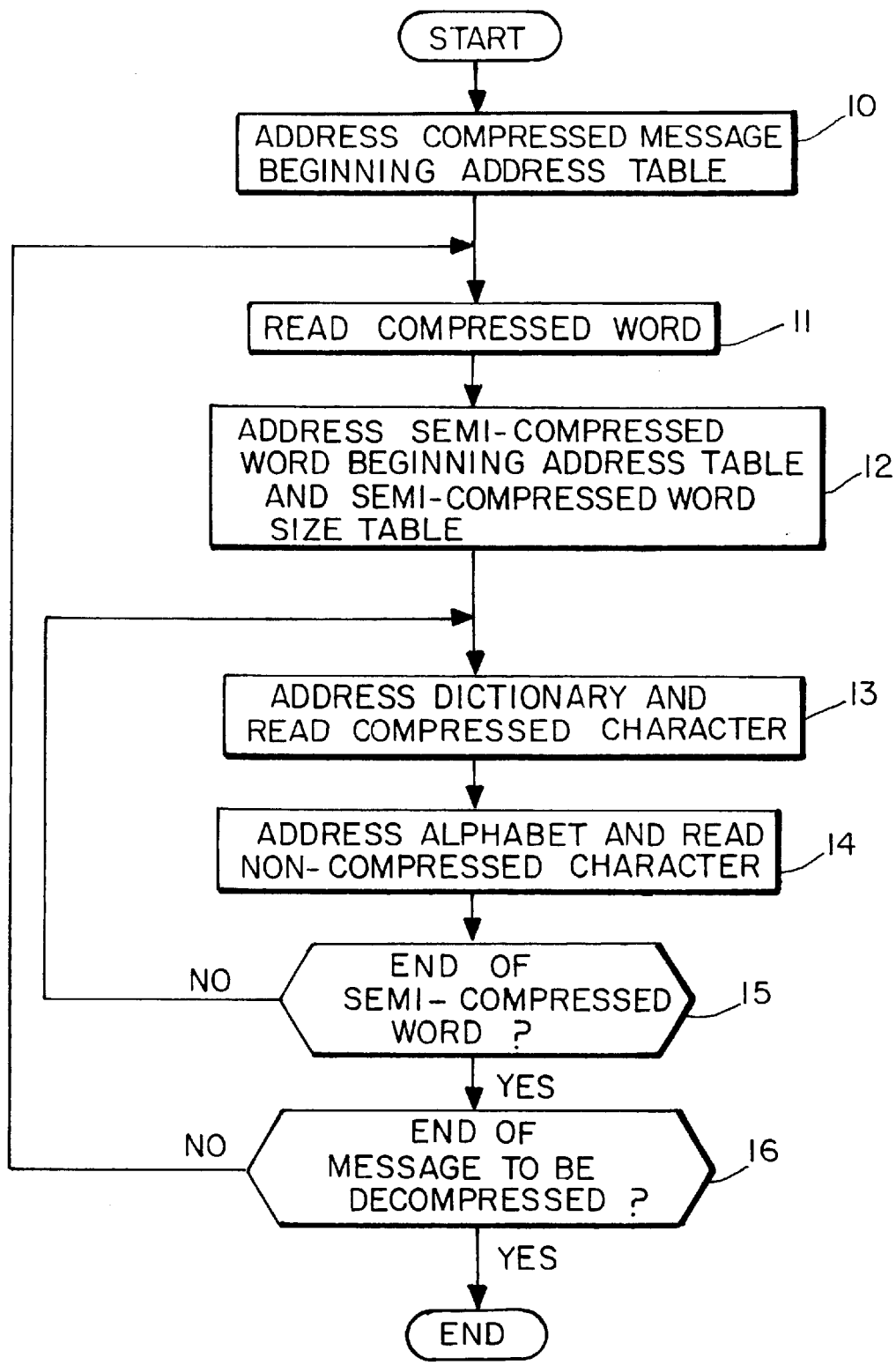
FIG. 2 is a flow chart showing the various steps of an implementation of a corresponding decompression method.

An example of a corresponding decompression method is shown in FIG. 2.

During a first step, referenced 10, of the method, the compressed message beginning address table is read at an address determined on the basis of information (assumed to be supplied) identifying the message to be decompressed, and at an address corresponding to the compressed message situated contiguously in the memory.

During a second step, referenced 11, the compressed word corresponding to the first word of the message to be decompressed is read at the compressed message beginning address obtained in this way.

The result of this reading makes it possible, during a third step, referenced 12, to address firstly the semi-compressed word beginning address table to obtain the address of the beginning of the semi-compressed word corresponding to the first word of the message to be decompressed, and secondly the semi-compressed word size table to obtain the size of the semi-compressed word.

By obtaining the address of the beginning of this semi-compressed word, it is possible, during a fourth step, referenced 13, to address the corresponding dictionary, and thus to obtain the first compressed character making up the word.

By reading the first compressed character, it is in turn possible, during a fifth step, referenced 14, to address the corresponding alphabet, and thus to obtain the corresponding non-compressed first character which can then be conveyed to a register serving to store the decompressed message to be displayed.

The current address is then replaced by the address of the following compressed character of the semi-compressed word in question, and so long as said current address remains lower than the sum of the address of the beginning of the semi-compressed word in question and of the size of said semi-compressed word (which corresponds to the test step referenced 15), the method of reading the non-compressed characters making up the word in question continues, the non-compressed characters obtained in this way being conveyed to said register serving to store the decompressed message to be displayed.

When the current address becomes higher than the sum of the address of the beginning of the semi-compressed word in question and of the size of said semi-compressed word, the method moves on to the following semi-compressed word, and so on so long as the address within the zone of the compressed messages remains lower than the address of the beginning of the compressed message stored contiguously in the memory (which corresponds to the test step referenced 16).

In this description, it is assumed that the exact number of bits corresponding to the looked-for information is stored at each address considered of the memory (whether it be a compressed message beginning address, a compressed word, a semi-compressed word beginning address, a semi-compressed word size, a non-compressed character, or a compressed character). However, the adaptations that might need to be made can be achieved by a person skilled in the art by conventional memory organization and addressing techniques, and they are therefore not described herein.

Figure 3:
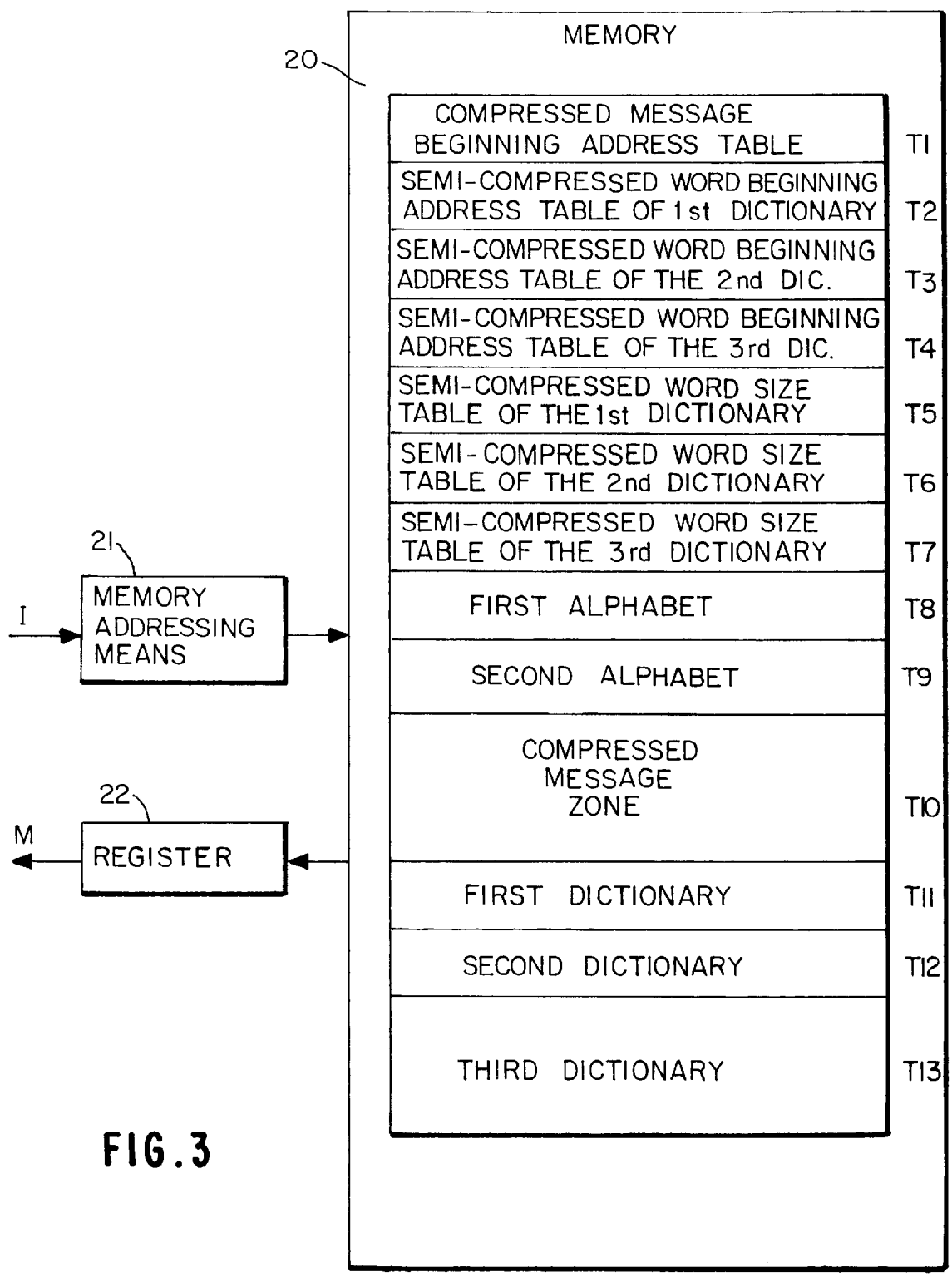
FIG. 3 is a diagram showing an embodiment of corresponding decompression apparatus.

FIG. 3 is a diagram showing corresponding decompression apparatus.

This apparatus includes a memory referenced 20 including, in the example considered, the following data zones:

T1: compressed message beginning address table;

T2: semi-compressed word beginning address table of the first dictionary;

T3: semi-compressed word beginning address table of the second dictionary;

T4: semi-compressed word beginning address table of the third dictionary;

T5: semi-compressed word size table of the first dictionary;

T6: semi-compressed word size table of the second dictionary;

T7: semi-compressed word size table of the third dictionary;

T8: first alphabet;

T9: second alphabet;

T10: compressed message zone;

T11: first dictionary;

T12: second dictionary; and

T13: third dictionary.

This apparatus further includes means 21 for addressing the memory, which means receive input information, referenced I, making it possible to identify the message to be decompressed, and they use the input information to generate the various addresses required for implementing the decompression method as described above.

The apparatus further includes a register 22 serving to store the decompressed message to be displayed, referenced M, prior to conveying it to display apparatus (not shown).

The assembly formed by the elements 20, 21, 22 may be included in a more general data-processing assembly, in particular a microprocessor, itself included in the equipment in question, such as in particular a telecommunications terminal, in particular a portable telephone.

What is claimed is:

1. A method of compressing messages, in particular messages intended to be displayed on a telecommunications terminal, in particular a portable telephone, wherein, with said messages being made up of words themselves made up of characters, the method comprising:

reading in said messages;

compiling an encoding table for compressing words, causing each compressed word represented by its rank in the table to correspond to a "semi-compressed" word made up of a sequence of compressed characters corresponding to the word;

compiling an encoding table for compressing characters, causing each compressed character represented by its rank in the table to correspond to a non-compressed character;

forming compressed messages from the compressed words.

2. A method according to claim 1, wherein, said encoding table for compressing words itself comprises at least two tables referred to as "dictionaries" and having mutually different storage capacities, and wherein the method further includes sorting the words making up said messages by frequency of appearance in said messages, the words that appear more frequently being placed in a smaller-capacity dictionary.

3. A method according to claim 1, wherein, said encoding table for compressing characters itself comprises two tables referred to as "alphabets" and having mutually different storage capacities, and wherein the method further includes sorting the characters making up said words by frequency of appearance in said words, the characters that appear more frequently being placed in a smaller-capacity alphabet.

4. A method according to claim 1, wherein the spaces between words in said messages are considered as words for the purposes of implementing the method.

5. A method according to claim 1, wherein, with the compressed messages being intended to be stored contiguously in a memory, and having various sizes, the method further includes compiling a compressed message beginning address table for indicating the addresses of the beginnings of said compressed messages in said memory.

6. A method according to claim 1, further including searching for words, referred to as "sub-words", included in longer words, referred to as "root words", and wherein, with only the root words being placed in said encoding table for compressing words, and with ranks in the table also being defined for the sub-words, provision is also made for compiling a semi-compressed word beginning address table and a semi-compressed word size table, these tables serving to indicate, respectively and for each rank in said encoding table, the beginning address and the size of the corresponding semi-compressed word, whether it be a root word or a sub-word.

7. A method for decompressing messages, in particular messages intended to be displayed on a telecommunications terminal, in particular a portable telephone, wherein, with said messages being made up of words themselves made up of characters, the method comprising:

reading in compressed messages;

addressing two encoding tables respectively with compressed words, an encoding table for compressing words, and with compressed characters, an encoding table for compressing characters;

causing each compressed word represented by its rank in the encoding table for compressing words to correspond to a "semi-compressed" word made up of a sequence of compressed characters corresponding to the word;

causing each compressed character represented by its rank in the encoding table for compressing characters to correspond to a non-compressed character; and forming said messages.

8. A method according to claim 7, wherein, with the compressed messages being intended to be stored contiguously in a memory, and having various sizes, the method further includes addressing a compressed message beginning address table for indicating the addresses of the beginnings of said compressed messages in said memory.

9. A method according to claim 7, wherein, with only "root" words including other shorter words referred to as "sub-words" being placed in said encoding table for compressing words, and with ranks in the table also being defined for the sub-words, the method further includes addressing a semi-compressed word beginning address table and a semi-compressed word size table, these tables serving to indicate, respectively and for each rank in said encoding table, the beginning address and the size of the corresponding semi-compressed word, whether it be a root word or a sub-word.

10. Apparatus for decompressing messages, in particular messages intended to be displayed on a telecommunications terminal, in particular a portable telephone, wherein, with said messages being made up of words themselves made up of characters, the apparatus includes:

a memory containing two encoding tables, namely an encoding table for compressing words and an encoding table for compressing characters;

memory addressing means for addressing the two tables with compressed words and with compressed characters and causing each compressed word represented by its rank in the encoding table for compressing words to correspond to a semi-compressed word made up of a sequence of compressed characters corresponding to the word, and causing each compressed represented by its rank in the encoding table for compressing characters to correspond to a non-compressed character.

11. Apparatus according to claim 10, wherein, with the compressed messages being stored contiguously in said memory, and having various sizes, said memory further includes a compressed message beginning address table for indicating the addresses of the beginnings of said compressed messages in said memory, and wherein the apparatus further includes means for addressing the compressed message beginning address table.

12. Apparatus according to claim 10, wherein, with only "root" words including other shorter words referred to as "sub-words" being placed in said encoding table for compressing words, and with ranks in the table also being defined for the sub-words, said memory further includes a semi-compressed word beginning address table and a semi-compressed word size table, these tables serving to indicate, respectively and for each rank in said encoding table, the beginning address and the size of the corresponding semi-compressed word, whether it be a root word or a sub-word, and wherein the apparatus further includes means for addressing the semi-compressed word beginning address table and the semi-compressed word size table.

* * * * *